US005386086A

United States Patent [19]

Sayles

[11] Patent Number: 5,386,086

[45] Date of Patent: Jan. 31, 1995

[54] COMPOSITE THERMOPLASTIC FILLER FOR BALLAST CANS FOR USE WITH FLUORESCENT LIGHTS

[75] Inventor: David C. Sayles, Huntsville, Ala.

[73] Assignee: The United States of America as represented by the Secretary of the Army, Washington, D.C.

[21] Appl. No.: 178,725

[22] Filed: Jan. 6, 1994

[51] Int. Cl.[6] ........................ H01L 23/28; H05K 5/06; B29C 67/16

[52] U.S. Cl. ............................ 174/52.2; 174/DIG. 2; 264/37; 264/115; 264/125; 264/DIG. 69; 336/96; 338/20

[58] Field of Search ........................ 174/52.2, DIG. 2; 264/37, 115, 125, DIG. 69; 336/96; 338/20

[56] References Cited

U.S. PATENT DOCUMENTS

| | | | |
|---|---|---|---|
| 2,674,646 | 4/1954 | Schoch | 174/52.2 |
| 2,882,505 | 4/1959 | Feder | 336/96 |
| 2,948,930 | 8/1960 | Herbst | 18/59 |
| 3,161,843 | 9/1964 | Hodges et al. | 336/96 |
| 3,319,203 | 5/1967 | Haughney | 336/96 |
| 3,403,367 | 9/1968 | Holzinger | 336/96 |
| 3,653,959 | 4/1972 | Kehr et al. | 117/201 |
| 4,206,436 | 6/1980 | Grunert et al. | 336/96 |
| 4,223,071 | 9/1980 | Boyer et al. | 428/411 |
| 5,036,580 | 9/1991 | Fox et al. | 29/605 |

*Primary Examiner*—Robert A. Dawson
*Assistant Examiner*—Dennis J. Chismar
*Attorney, Agent, or Firm*—Hugh P. Nicholson; Freddie M. Bush

[57] ABSTRACT

A process for fabrication of a filler for a ballast container used with fluorescent lighting employs a mixture of a high-density polyethylene in powdered form (derived from recycled milk containers) and dry sand. After loading the specified mixture into a ballast container to fill the unfilled volume remaining after the ballast container has electrical components installed, a closure means is placed on the loaded and filled ballast container, subsequently heated for a predetermined time period to achieve melting of the specified high-density polyethylene and dry sand mixture. After cooling the melted, high-density polyethylene, the high-density polyethylene and dry sand mixture fuses into a solid mass. A preferred mixture is comprised of a 50/50 weight percent ratio of the specified high-density polyethylene and dry sand.

4 Claims, No Drawings

COMPOSITE THERMOPLASTIC FILLER FOR BALLAST CANS FOR USE WITH FLUORESCENT LIGHTS

The invention described herein may be manufactured, used, and licensed by or for the Government for governmental purposes without the payment to me of any royalties thereon.

BACKGROUND OF THE INVENTION

The current process for the fabrication of ballast fillers involves potting with a mixture of asphalt pitch and sand. The pitch has to be melted in huge pots on the assembly lines. The described arrangement results in a high temperature environment for the employees to work in.

Anyone who is familiar with the characteristic odor of a ballast failure and the leaking tar from the ballast, which sometimes drips on floor or furniture, recognizes the need for an improved potting process for ballasts for fluorescent lights.

Therefore, an object of this invention is to provide a process for a novel potting material for ballasts used with fluorescent light bulbs.

Another object of this invention is to provide a novel potting material having a uniform and known composition of very low electrical conductivity and high thermal stability for use in ballasts for fluorescent light.

SUMMARY OF THE INVENTION

The process disclosed in accordance with this invention employs a novel potting material for use in the fabrication of fillers for ballasts used with fluorescent light bulbs. The process of the instant invention employs a mixture of a thermoplastic resin namely, high-density polyethylene, in combination with silica (sand), in a 50/50 weight percent ratio, as the filler for the ballast container. The polyethylene which is in powder form as derived from recycled milk bottles is uniformly mixed with sand and added to the ballast container. Upon heating at 300° F., by passing the loaded ballast container on a conveyor belt through a conventional oven, the polyethylene undergoes melting, and fuses the mixture into a solid mass.

DESCRIPTION OF THE PREFERRED EMBODIMENT

The preferred thermoplastic resin for use in the process of this invention is high-density polyethylene in powdered form which upon heating at 300° F. melts in a 50/50 mixture of sand and solidifies the mixture into a solid mass upon cooling.

The preferred high-density polyethylene is in powdered form as derived from recycled milk bottles. A uniform mixture of the powdered polyethylene and dry sand is prepared and loaded into a ballast container having an open top to permit receiving the uniform mixture. The loaded ballast container, including the electrical components (e.g., transformer and electrical wiring including electrical leads extending from the container for installing in an electrical circuit for fluorescent lighting), is provided with a top closure means. The loaded and closed ballast container and contents are heated to 300° F. for a predetermined time to achieve melting of the high-density polyethylene. The melted high-density polyethylene and sand mixture is subsequently allowed to cool and fuse into a solid mass.

This invention process offers the following significant improvements over the method currently in operation. These are:

a. Use of a thermoplastic resin of uniform and known composition of very low electrical conductivity and high thermal stability;

b. This composition is recyclable with low wastage;

c. Overheating of the ballast contents will only result in the formation of a stalactite-type of drip adhering to the ballast container; and, d. Polyethylene is a clear, colorless thermoplastic in marked contrast to asphalt pitch.

The high-density polyethylene in powdered form is derived from recycled milk containers (available commercially from Spinco of Athens, Alabama).

I claim:

1. A process for fabrication of filler for a ballast container used with fluorescent lighting, said process comprising:

(i) providing said ballast container containing conventional electrical components as required for use in a fluorescent light circuit, said ballast container having an open top for receiving filler materials for filling unfilled space volume within said ballast container;

(ii) loading said unfilled space volume within said ballast container with said filler materials, said filler material comprising a mixture of high-density polyethylene in powdered form and dry sand;

(iii) providing said loaded and filled ballast container with a top closure means to close said ballast container;

(iv) heating said loaded and closed ballast container to about 300° F. for a predetermined time period to achieve melting of said high-density polyethylene and dry sand mixture; and, (v) allowing said melted, high-density polyethylene to cool and fuse into a solid mass comprised of said high-density polyethylene and dry sand.

2. The process for fabrication of filler for a ballast container as defined in claim 1, wherein said mixture of high-density polyethylene in powdered form derived from recycled milk containers and dry sand loaded into said ballast container is in a 50/50 weight percent ratio.

3. The ballast with filler as fabricated in accordance with the process as defined in claim 1, wherein said fillers for said ballast container comprises a fused mixture of high-density polyethylene and dry sand.

4. The ballast with filler as fabricated in accordance with the process as defined in claim 2 wherein said fillers for said ballast container comprise a fused mixture of said high-density polyethylene and dry sand.

* * * * *